(12) United States Patent
Mitani et al.

(10) Patent No.: US 6,916,433 B2
(45) Date of Patent: Jul. 12, 2005

(54) CONDUCTIVE ADHESIVE, APPARATUS FOR MOUNTING ELECTRONIC COMPONENT, AND METHOD FOR MOUNTING THE SAME

(75) Inventors: Tsutomi Mitani, Akashi (JP); Hiroaki Takezawa, Nara (JP); Yukihiro Ishimaru, Hirakata (JP); Takashi Kitae, Higashiosaka (JP); Yasuhiro Suzuki, Atani (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 451 days.

(21) Appl. No.: 10/030,235

(22) PCT Filed: Feb. 27, 2001

(86) PCT No.: PCT/JP01/01475

§ 371 (c)(1),
(2), (4) Date: Mar. 26, 2002

(87) PCT Pub. No.: WO01/64807

PCT Pub. Date: Sep. 7, 2001

(65) Prior Publication Data

US 2002/0158232 A1 Oct. 31, 2002

(30) Foreign Application Priority Data

Feb. 29, 2000 (JP) ........................................ 2000-053662
May 30, 2000 (JP) ........................................ 2000-160881

(51) Int. Cl.$^7$ ............................ H01B 1/22; H01L 23/04; H05K 3/32
(52) U.S. Cl. ................... 252/500; 252/511; 252/512; 252/514; 257/783; 257/786; 428/402; 427/212
(58) Field of Search ................ 252/500, 511, 252/512, 514, 513; 257/783, 786; 428/402, 355 R, 551; 427/212, 216

(56) References Cited

U.S. PATENT DOCUMENTS

| 5,045,236 | A | * | 9/1991 | Tsunaga et al. .............. 252/512 |
| 5,173,765 | A | * | 12/1992 | Nakayoshi et al. ......... 257/783 |
| 5,316,698 | A | | 5/1994 | Tani et al. |
| 5,405,707 | A | | 4/1995 | Tani et al. |
| 5,804,631 | A | * | 9/1998 | Mine et al. ................. 524/440 |
| 5,968,420 | A | | 10/1999 | Thuny et al. |
| 6,395,332 | B1 | * | 5/2002 | Hanawa et al. ............. 427/216 |

FOREIGN PATENT DOCUMENTS

| EP | 855 720 | 7/1998 |
| GB | 1 098 441 | 3/1987 |

(Continued)

Primary Examiner—Mark Kopec
Assistant Examiner—Kallambella Vijayakumar
(74) Attorney, Agent, or Firm—Merchant & Gould P.C.

(57) ABSTRACT

A conductive adhesive comprises main components of a conductive filler and a binder resin, and a content of the conductive filler is in a range from 20 wt % to 70 wt %. It is preferable that at least a part of the conductive filler has protrusions. A dendrite metal filler is especially preferred. When this adhesive is compressed, the resin component is squeezed out, while the conductive filler component remains inside. As a result, the concentration of the conductive filler component is raised inside, and this is useful in connecting the electrodes by scratching the surfaces of the electrodes. No solder is required in forming a conductive adhesive 3 on a substrate electrode 2 of a circuit substrate 1 and also for packaging an electronic element 4. Provided also are a package of an electronic element using the conductive adhesive with improved initial and long-term reliability, and a method of packaging the same.

18 Claims, 15 Drawing Sheets

U.S. PATENT DOCUMENTS

| | | | | |
|---|---|---|---|---|
| JP | 61-31454 | 2/1986 | | |
| JP | 1-165654 | 6/1989 | | |
| JP | 01-165654 | * 6/1989 | ........... | C08L/63/00 |
| JP | 1-246705 | 10/1989 | | |
| JP | 3-21868 | 1/1991 | | |
| JP | 03-176906 | 7/1991 | | |
| JP | 3176906 | * 7/1991 | ........... | H01B/1/22 |
| JP | 5-12916 | 1/1993 | | |
| JP | 05-151821 | 6/1993 | | |
| JP | 06-325617 | * 11/1994 | ........... | C09D/5/24 |
| JP | 7-149524 | 6/1995 | | |
| JP | 9-95651 | 4/1997 | | |
| JP | 9-245522 | 9/1997 | | |
| JP | 09-245522 | * 9/1997 | ............ | H01B/1/22 |
| JP | 10-147801 | 6/1998 | | |
| JP | 11-152458 | * 6/1998 | .............. | C09J/9/02 |
| JP | 10-208547 | 8/1998 | | |
| JP | 10-212501 | 8/1998 | | |
| JP | 10-265748 | 10/1998 | | |
| JP | 11-21477 | 1/1999 | | |
| JP | 11-092727 | * 4/1999 | ............ | C09C/1/04 |
| JP | 11-152458 | 6/1999 | | |
| JP | 11-264001 | 9/1999 | | |
| SU | 1098441 | * 3/1987 | | |

* cited by examiner

CONDUCTIVE ADHESIVE, APPARATUS FOR MOUNTING ELECTRONIC COMPONENT, AND METHOD FOR MOUNTING THE SAME

TECHNICAL FIELD

The present invention relates to a conductive adhesive used for a thermal conductive medium or electrical contacts of electronic elements, a package of an electronic element using the conductive adhesive, and a method of packaging. More specifically, the present invention relates to a conductive adhesive that has excellent adhesion strength and stress relaxation property and that can be produced at a low cost, a package of an electronic element using the same and a method of packaging.

BACKGROUND ART

Due to a recent trend of environmental consciousness, controls on lead included in solder alloys will be imposed in the field of electronic packaging, and thus, establishment of a lead-free packaging a technique, i.e., a technique to join electronic elements with a lead-free material is an urgent necessity. The lead-free packaging technique includes packaging using mainly a lead-free solder or a lead-free conductive adhesive. Conductive adhesives have been noted particularly in the technique since they are expected to provide merits such as joint flexibility, lower packaging temperatures, no need of organic solvents, and no need of washes.

A conventional conductive adhesive is based on, e.g., an epoxy resin-based binder resin in which a conductive filler of a metal powder such as silver is dispersed. When an electronic element and a substrate electrode are connected through the conductive adhesive, the binder resin contacts the conductive filler with other conductive filler, the element electrode, and with the substrate electrode so as to provide electrical connection while the electronic element and the substrate electrode are adhered for mechanical connection. Since the electronic element and the circuit substrate are connected at the joints with a resin component, it deforms flexibly corresponding to deformation caused by heat and external force. Therefore, it has less cracks when compared to solder connection with an alloy. Moreover, a typical conductive adhesive has a joint temperature as low as 150° C. while the joint temperature of an alloy is about 240° C., electronic elements with reduced heat resistance can be used. Furthermore, the energy requirement for the production can be reduced.

Therefore, a conductive adhesive is expected as an alternative to solder, since it has excellent performance over solder connection.

However, a conventional conductive adhesive as a replacement for solder cannot provide a connection strength corresponding to that of solder. Another problem is that such an adhesive is more expensive when compared to solder as package materials of electronic elements.

The following description is on connection strength. A conductive adhesive adheres to an electronic element and to a substrate electrode since, for example, an epoxy-based binder resin adheres to the element and the substrate electrode. Among resin materials, the epoxy-based binder resin has an especially strong adhesion with metals, and the resin has excellent mechanical strength after hardening. Therefore, it has been used for adhesives for many elements. However, unlike solder, since the joint is not provided by alloy, the adhesives cannot provide the connection strength of solder against external force applied to the connected part due to bending of the substrate and impacts. The main factors are as follows.

The epoxy resin as a binder component for a conventional conductive adhesive has strong adherence to metal of a substrate electrode. However, it has a high elastic modulus and less flexibility. When a substrate comprising such a resin is subjected to bending deformation, stress is concentrated at the joint interface between the electronic element and the conductive resin. When the stress exceeds the strength of connection between the electronic element and the conductive resin, peeling may occur at the interface. Such an adhesive resin cannot correspond to deformation caused by bending, vibration and impact generated in the substrate at the connected part of the electronic element and the circuit substrate.

Concerning the flexibility of conductive resin, JP-A-3-21868 for utility model suggests an elastic conductive adhesive containing an elastic adhesive as a binder resin component.

This conductive resin described in JP-A-3-21868 has more improved flexibility when compared to the other examples of epoxy resins. However, it provides less conductivity when compared to an epoxy resin that has conductance provided by contraction of the hardened resin. And the conductive filler is of a spherical shape, scale shape, or a mixture thereof. Therefore, it is difficult to decrease the resistance of the conductive resin to the level of the resistance of an epoxy-based resin.

In a conventional technique, a typical conductive adhesive contains a conductive filler of about 85 vol. %. A conductive filler such as silver has a specific weight of about 10 while the binder resin has a specific weight of about 1.1. This substantially decreases the mechanical connection or the connection strength at the connected part to a half, i.e., the area that the binder resin contacts with the element electrode and the substrate electrode is halved. As a result, the connection strength of the adhesive containing filler will be lowered when compared to a case using a binder resin alone.

As mentioned above, a conventional conductive adhesive has a high elastic modulus that leads to problems in adhesion strength with either an electronic element or with a circuit substrate, and also in connection reliability. Also, the conductive adhesive has problems concerning joint interface with the electronic element and with the circuit substrate.

A conventional conductive resin contains a conductive filler such as silver powder in as much as about 85 vol. %. Since the conductive filler accounts for about 70% or 80% of the cost for the conductive adhesive, it is substantially impossible to reduce the cost.

Conventional conductive adhesives have a merit from the aspect of flexibility over solder but the connection strength with respect to dynamic deformations such as substrate bending, vibration, and impact is insufficient. Moreover, the conductive adhesive raises the manufacturing cost. These demerits inhibit the conductive adhesives from replacing the commonly used solder for connection.

DISCLOSURE OF INVENTION

For solving the above-mentioned problems of conventional techniques, the present invention provides an inexpensive conductive adhesive improved to decrease cracks, a package of an electronic element using the same, and a method of packaging.

A conductive adhesive of the present invention comprises a conductive filler and a binder resin as main components, in which a content of the conductive filler is from 20 wt % to 70 wt %. Here, a "main component" denotes a component contained in a range from 80 wt % to 100 wt % of the material.

A package of an electronic element according to the present invention comprises a circuit substrate electrode and an electronic element electrode that are electrically connected to each other through a conductive adhesive containing a conductive filler and a binder resin, wherein an average content of the conductive filler is in a range from 20 wt % to 70 wt %. At a portion where the adhesive is in a gap between the electrodes, the content of the conductive filler is higher than the average content while the adhesive squeezed outside the gap contains less conductive filler than the average content.

The present invention provides a method of electrically connecting a circuit substrate electrode and an electronic element electrode through a conductive adhesive containing a conductive filler and a binder resin, wherein an average content of the conductive filler is in a range from 20 wt % to 70 wt %. The process comprises steps of: applying the adhesive to a gap between the circuit substrate electrode and the electronic element electrode; applying pressure ranging from 0.01 MPa to 50 MPa to the circuit substrate electrode and the electronic element electrode; squeezing the adhesive containing less conductive filler so as to make the content of the conductive filler in the adhesive present in the gap between the electrodes higher than the average content.

BEST MODE FOR CARRYING OUT THE INVENTION

In the present invention, a content of a conductive filler is set to be lower than that of a conventional conductive adhesive. Thereby, adhesive components at the interfaces for connection to elements and circuit substrate increase, and the connection strength at the interfaces is improved. As a result, adhesion strength is improved further at the connection interface between the electronic elements and the conductive adhesive and also between the circuit substrate electrode and the conductive adhesive. This improves the connection reliability of the electronic elements.

It is preferable for the conductive adhesive that the conductive filler comprises a metal filler having protrusions.

Figure 1:
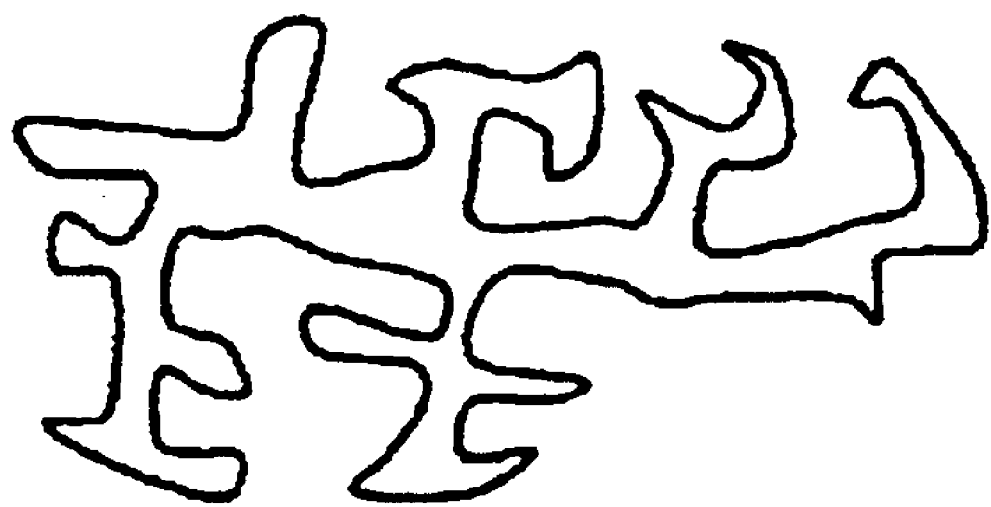
FIG. 1 is a schematic view of a dendrite conductive filler of the present invention.

It is also preferable that the conductive filler having protrusions is a dendrite filler. Here, "dendrite" denotes a figure like branches growing from a trunk. FIG. 1 shows a schematic view of a dendrite conductive filler.

In a preferred embodiment, a conductive filler is a mixture of 30–99 wt % of a filler having protrusions and 1–70 wt % of at least one kind of filler having a shape selected from the group consisting of scales, Rakes and particles. The conductive filler can be a mixture of a filler of either scale-shape or substantial particles, and a filler of a dendrite shape. It is preferable that the content of the conductive fuller having a dendrite shape is at least 30 wt %.

It is preferable for the conductive adhesive that the content of the conductive filler is in a range from 30 wt % to 50 wt %.

It is preferable that the conductive filler is at least one metal selected from the group consisting of copper, silver, gold, platinum, palladium, nickel, stainless steel and an alloy thereof.

The conductive filler can be prepared by coating a metal with at least one substance selected from silver, gold, palladium, silica and resin.

It is preferable that the conductive filler has an average particle diameter ranging from 1 $\mu$m to 100 $\mu$m. Here, 'average particle diameter' denotes the apparent outer dimension of a filler particle including a space for the case of the above-mentioned dendrite, scale and particle shaped fillers. For the dendrite filler shown in FIG. 2, an average particle diameter can be an average length in the longitudinal direction.

It is preferable that the dendrite filler is a copper powder having an oxygen concentration of at most 0.5 atomic %. It is preferable that the copper filler is coated with a fatty acid in a range of 0.01–5.0 wt % to the weight of the copper filler, and the fatty acid has a melting point of at most 200° C. and is solid at room temperature. An example of fatty acids having a melting point of at most 200° C. and being solid at room temperature is at least one selected from the group consisting of stearic acid, myristic acid, citric acid, glutaric acid, palmitic acid and maleic acid. A method of producing the above-mentioned dendrite filler is proposed in JP-A-11-264001, which is applicable for the present invention.

Figure 2:
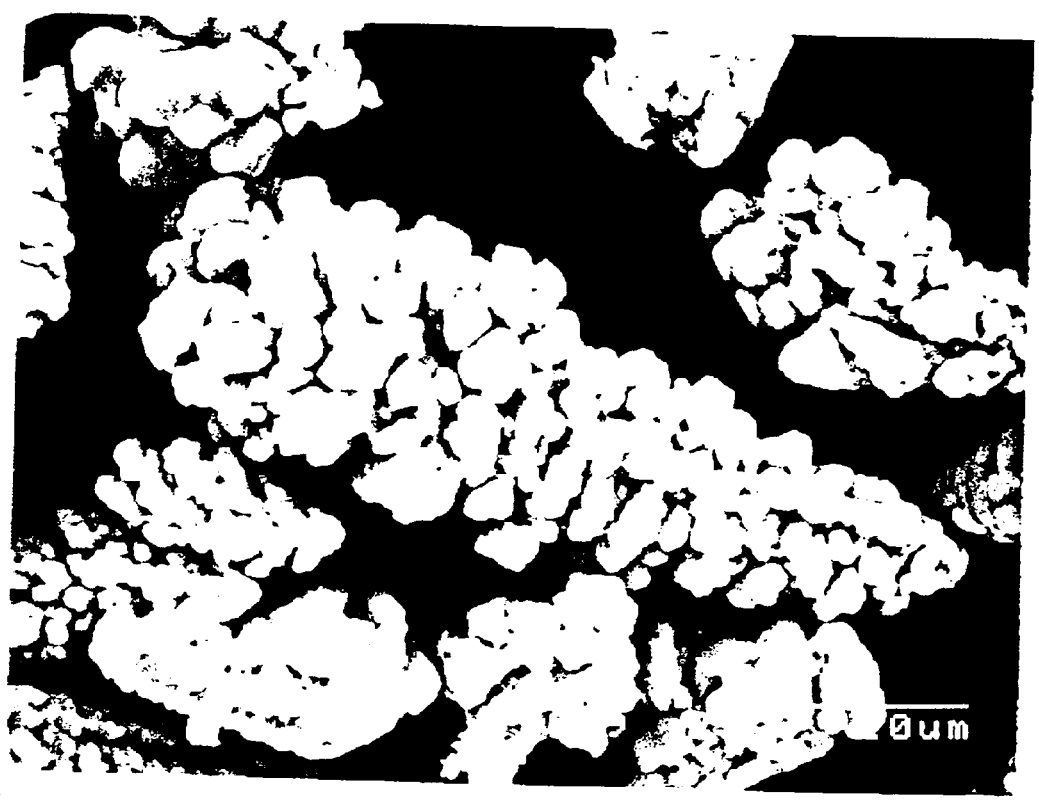
FIG. 2 is a photocopy of a dendrite conductive filler of the present invention, which is taken with an electron microscope (×3000).

Another example is a copper dendrite filler supplied as "CUE07PB" (trade name) by Kojundo Chemical Laboratory Co., Ltd. FIG. 2 is a photocopy of the product taken with a scanning electron microscope (SEM)(×3000). A big copper dendrite filler located in the center can be considered as one particle.

It is preferred in the conductive adhesive that the binder resin is an elastic adhesive resin. Such an elastic adhesive resin is called in general an elastic adhesive. Since the elastic resin has a smaller elastic modulus when compared to a conventional epoxy resin binder, it is flexible and thus, it can absorb force applied to respective connected parts such as stress caused by a difference of coefficient of thermal expansion between an electronic element and a circuit substrate, stress caused by deformation such as bending of the circuit substrate, and stress caused by a drop impact. A typical epoxy resin contained in a binder resin of a conventional conductive adhesive has a comparatively large elastic modulus of about $1\times10^4$ MPa in a temperature range from −50° C. to 50° C., and the elastic modulus is lowered sharply to about 1 MPa in a temperature range from 80° C. to 130° C. On the other hand, an elastic modulus of the elastic adhesive used in the present invention is stable and as small as about 10 MPa in a temperature range from −50° C. to 130° C. A preferred example of the elastic adhesive is a thermosetting resin adhesive comprising a denatured silicon resin matrix in which epoxy resin is dispersed (e.g., "PM-165" (trade name) supplied by Cemedyne Co., Ltd.). This kind of adhesive has excellent adhesion strength, deformation absorbency, waterproof reliability, high temperature reliability and so on. In addition to the thermosetting resin, room temperature setting resin, radiation setting resin, thermoplastic resin or the like can be used.

A conductive filler according to the present invention can be provided at a low cost, since it reduces the amount of contained conductive filler that may raise the cost.

It is preferable for a package of electronic elements according to the present invention that an adhesive applied to a gap between the circuit substrate electrode and the electronic element electrode contains a conductive filler in a range from 75 wt % to 95 wt %. This indicates that the content of the conductive filler is higher in the gap between the circuit substrate electrode and the electronic element electrode. The reason follows. Since the circuit substrate electrode and the electronic element electrode are applied with pressure ranging from 0.01 MPa to 50 MPa, the conductive adhesive is squeezed out from the gap between the electrodes. As a result, more conductive filler remains in the gap and thus, the content of the filler in the gap is raised. Particularly, metal filler having dendrite protrusions will be prevented from moving since the filler components are entangled with each other. Such a filler tends to remain in the gap while more resin components will be squeezed out.

Moreover, the metal filler having protrusions can scratch the surfaces of the circuit substrate electrode and of the electronic element electrode partially in order to connect the electrodes by application of pressure ranging from 0.01 MPa to 50 MPa to both the electrodes. Since a typical electronic element electrode comprises solder, tin, or a tin alloy while a typical substrate electrode contains copper, the metal filler scratches oxide coatings formed on the electrode surfaces. This provides certain conductance and increases a contact area between the metal filler and the surfaces of the electrodes.

Metal filler having dendrite protrusions will be prevented from moving since the filler components are entangled with each other. As a result, packaging can be carried out when spacing between the element electrode and the substrate electrode is at least 1.1 times a minimum dimension (D min) of a smallest conductive filler contained in the conductive resin and at most 20 times a maximum dimension (D max) of a biggest conductive filler contained in the conductive resin.

As mentioned above, the conductive adhesive of the present invention contains the dendrite conductive filler. In a comparison with a conductive filler used for conventional conductive adhesives, each dendrite filler has a complicated surface shape, and this increases contact points to contact with other filler, the electronic element electrode or with the circuit substrate electrode. As a result, connection resistance of the electronic element can be reduced to equal to or less than that of the conventional conductive adhesive. A preferred example of the dendrite conductive filler is an electrolytic copper powder.

The dendrite conductive filler can be mixed with either a scaly filler or a conductive filler shaped to be particles. Alternatively, the dendrite conductive filler can be mixed with the scaly filler and the conductive filler of a particle shape.

The thus-shaped conductive filler can be used preferably for providing a flexible package of an electronic element since the connection resistance of the electronic element is not inferior to a case of solder connection.

Conductive filler containing dendrite fillers has stable connection resistance against bending of the substrate since the conductive fillers entangle with each other.

The use of the conductive adhesive of the present invention is not limited to a replacement of solder but it can be used for a conductive filler to be filled in inner-via-holes formed in a circuit substrate in the thickness direction.

The present invention will be explained further by referring to the attached drawings.

(First Embodiment)

FIGS. 3A–3D are cross-sectional views to illustrate a package of an electronic element in a first embodiment of the present invention. To a substrate electrode 4 formed on a circuit substrate 5, an element electrode 2 of a chip type electronic element 1 such as a 3216-sized jumper chip resistor is connected electrically by means of a conductive adhesive 3. In this embodiment, the conductive adhesive 3 comprises a conductive filler having protrusions, and the conductive filler composes a structure of at least two layers, in which the conductive filler of the conductive adhesive 3 is contacted with a metal in the element electrode 2. Since the conductive filler composes a structure of at least two layers, distortion caused by a difference in the thermal expansion between the jumper-chip resistor 1 and the circuit substrate 5 will be absorbed easily, and thus, the connection reliability is improved.

Figure 3A:
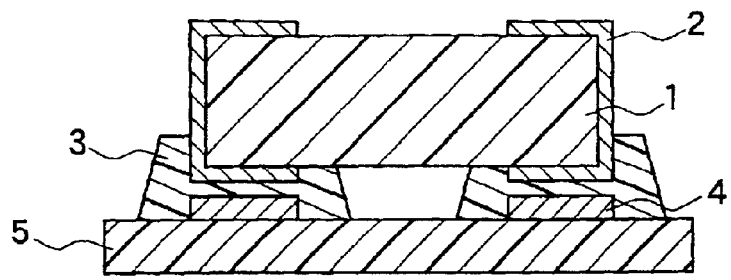
FIGS. 3A–3D are cross-sectional views to show a method of packaging an electronic element in a first embodiment of the present invention.
Figure 3B:
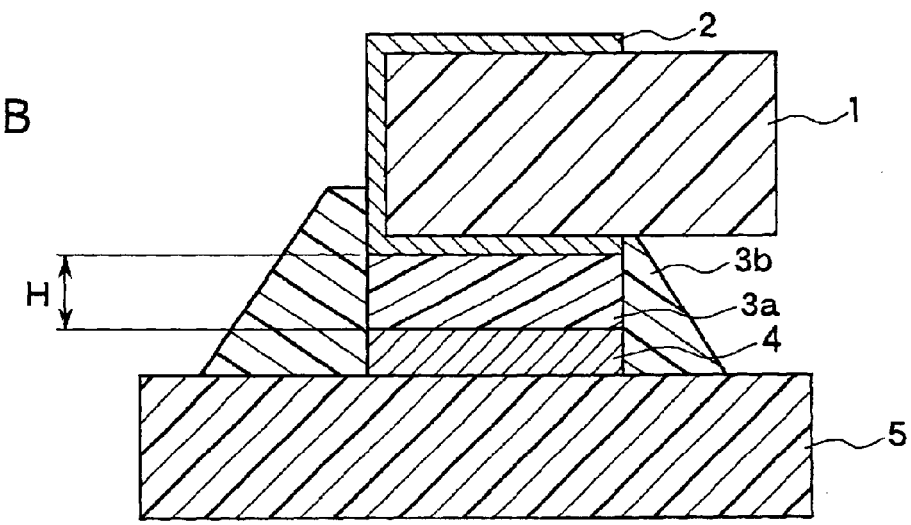

FIG. 3B is an enlarged view of a connected part of one element electrode 2 shown in FIG. 3A. Numeral 3a denotes a conductive adhesive gap portion interposed between the element electrode 2 and the substrate electrode 4, and 3b denotes a periphery of a conductive adhesive located around the conductive adhesive gap portion 3a. The concentration of the conductive filler is higher in the gap portion 3a of the conductive adhesive than in the periphery 3b of the same adhesive. Since the electrical resistance is lowered as the concentration of the conductive filler is raised, the electrical resistance in the gap portion 3a is lower than the electrical resistance in the periphery 3b, so that variation in the connection resistance can be suppressed even under an influence of the distortion.

Figure 3C:
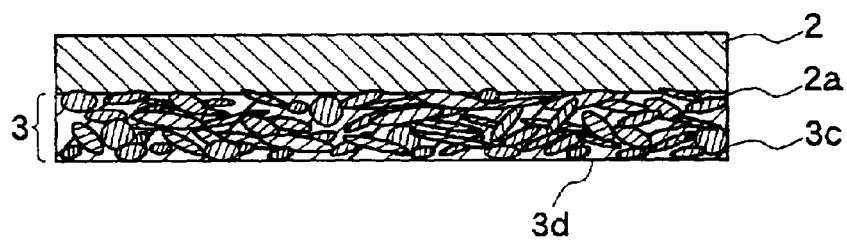

FIG. 3C is an enlarged schematic view to show a connection interface between the element electrode 2 and the conductive adhesive 3. Numeral 2a denotes an electrically resistant layer comprising a surface oxide layer or the like formed on a surface of the element electrode 2. The conductive adhesive 3 comprises a conductive filler 3c and a resin 3d, both of which are shown separately. On this connection interface, the electrically resistant layer 2a is either eliminated or broken so that at least one part of the conductive filler 3c is contacted with a metal of the element electrode 2, diffusion layers of the components are formed, or the conductive filler 3c is fused with the element electrode 2. Thereby, the metal composing the electrode is contacted or connected to a metal composing the conductive filler 3c so as to decrease connection resistance, and generation and growth of an oxide layer on the connection interface can be suppressed. Such a structure is useful especially in preventing problems from occurring at the connection interface when the electronic element or the electrode of the circuit substrate has a surface of a metal selected from the group consisting of metals susceptible to oxidation, e.g., solder and tin.

Figure 3D:
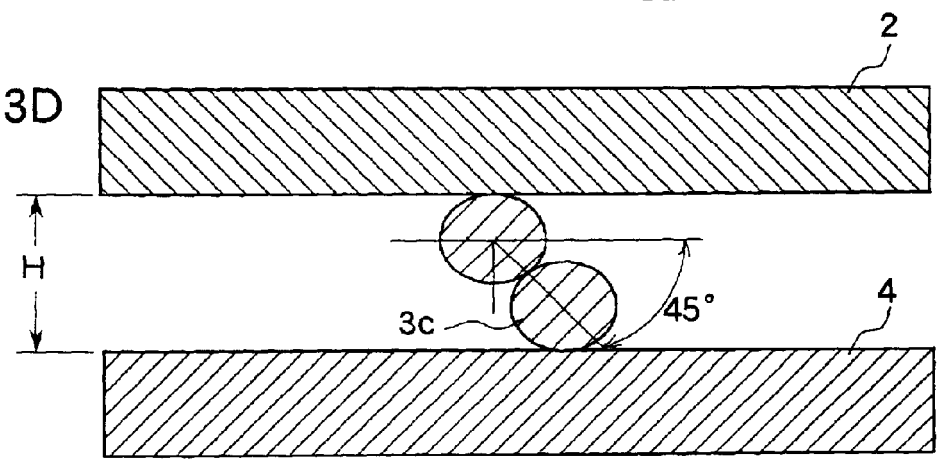

FIG. 3D is a schematic view to show the conductive filler 3c existing in the spacing between the element electrode 2 and the substrate electrode 4. Spacing H between the element electrode 2 and the substrate electrode 4 is controlled to be not less than 1.1 times a minimum dimension (D min) of a smallest conductive filler contained in the conductive resin and not more than 20 times the maximum dimension (D max) of a biggest conductive filler contained in the conductive resin. When the spacing is less than 1.1 times of the D min and the conductive fillers are spherical, conductive filler components located above will slide down the lower filler components, and thus, the two layers in the spacing are reduced to only one layer. That is, a structure comprising two or more layers cannot be formed in the spacing between the element electrode 2 and the substrate electrode 4. When the spacing exceeds 20 times the D max, the conductive adhesive will have a larger resistance, and this will increase the connection resistance between the element electrode 2 and the substrate electrode 4. As a result, packages with high quality cannot be obtained.

(Second Embodiment)

Figure 4A:
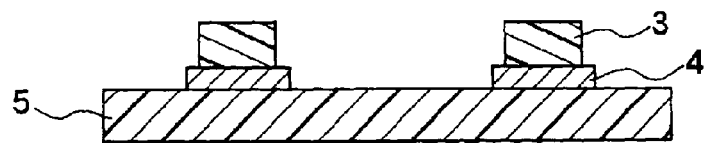
FIGS. 4A–4D are cross-sectional views to show a method of packaging an electronic element in a second embodiment of the present invention.
Figure 4B:
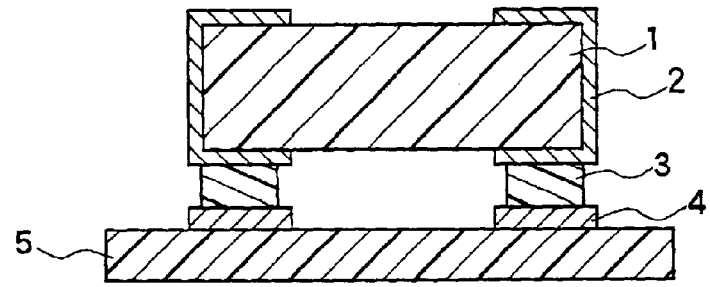
Figure 4C:
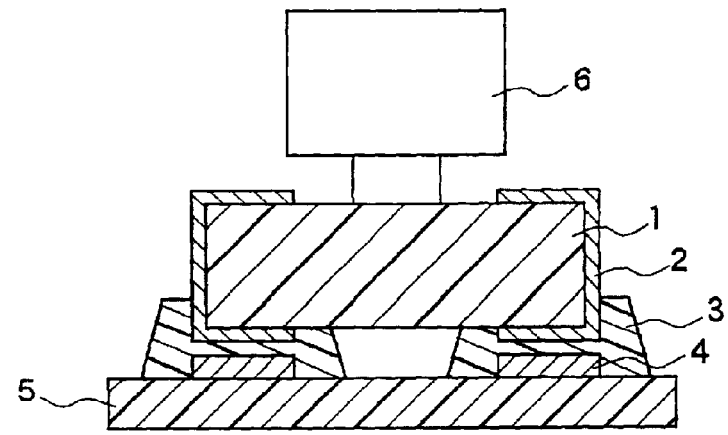
Figure 4D:
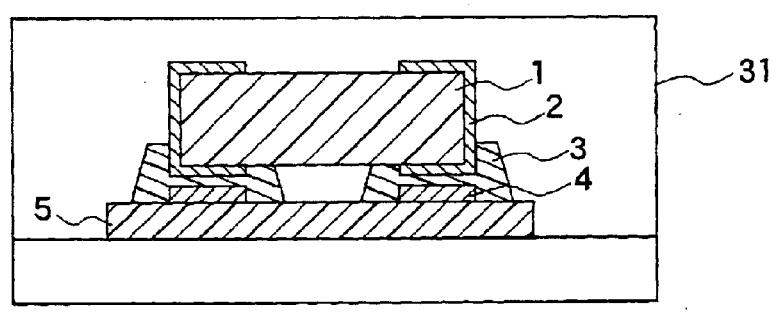

FIGS. 4A–4D are cross-sectional views to illustrate a method of packaging an electronic element in a second embodiment of the present invention. First, as shown in FIG. 4A, a conductive adhesive 3 is pattern-formed on a substrate electrode 4 of a circuit substrate 5. Next, as shown in FIG. 4B, a chip-type electronic element 1 such as a 3216-sized jumper chip resistor is mounted on a determined position of the conductive adhesive 3. Next, as shown in FIG. 4C, the electronic element 1 is pressed from above by means of a pressing head 6. Next, as shown in FIG. 4D, the circuit substrate 5 with the mounted electronic element 1 is introduced into a hot air drying furnace 31 so as to harden the conductive adhesive 3.

This embodiment is characterized in that the electronic element 1 is pressed while interposing the conductive adhesive 3 between the electronic element 1 and the circuit substrate 5 prior to the hardening of the conductive adhesive 3. When the element electrode 2 is connected to the substrate electrode 4 by means of the conductive adhesive 3, the conductive adhesive 3 is formed in general on the predetermined substrate electrode 4 by either printing or dispensing. Later, the electronic element 1 is mounted by positioning. In this case, mounting an electronic element 1 on the conductive adhesive 3 may vary the spacing between the element electrode 2 and the substrate electrode 4, and also increase variations in the initial value of the connection resistance and reliability. The spacing can be kept constant by introducing a pressing step as described in this example. Moreover, the pressure breaks a surface oxide layer of the electrode in order to provide a good connection due to a direct contact between the metal of the substrate electrode 4 and a metal of the conductive filler having protrusions. This will suppress variation in the connection resistance.

A pressure range effective for suppressing variation in the connection resistance is from 10 KPa to 50 MPa, or preferably, from 20 KPa to 20 MPa. When the applied pressure is less than 10 KPa, the spacing between the element electrode 12 and the substrate electrode 14 becomes greater than 20 times the maximum dimension (D max) of the biggest conductive filler, which will provide insufficient effect in breaking surface oxide layers of the electrodes. When the pressure exceeds 50 MPa, the electronic element us subject to excessive pressure, which may result in malfunction or failure.

Figure 5:
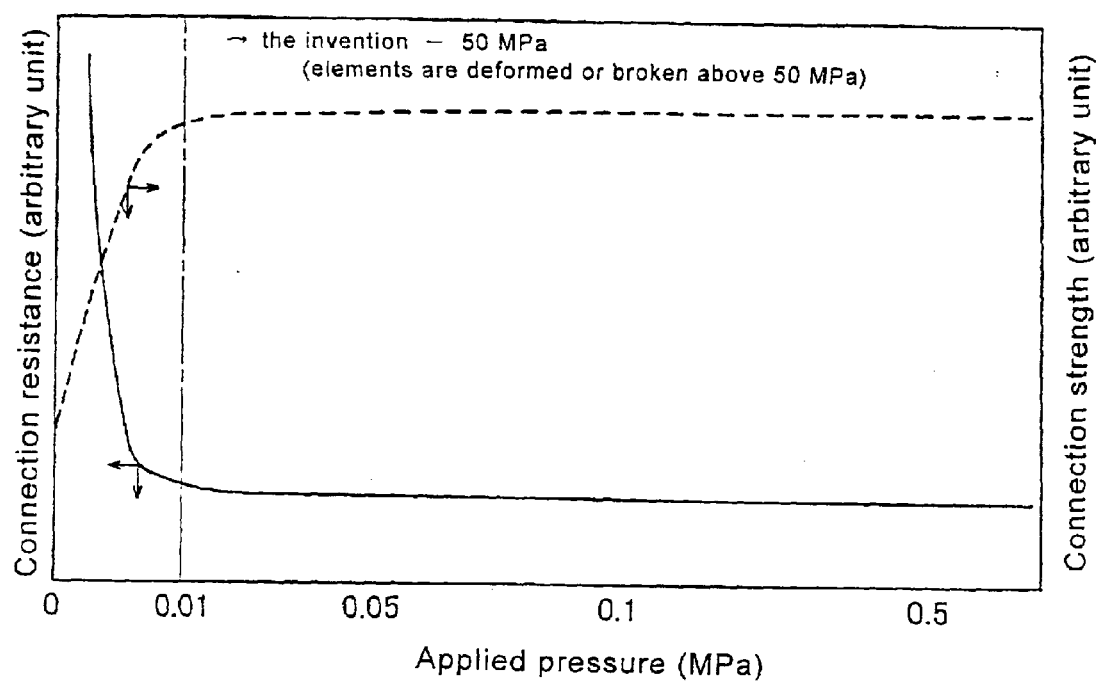
FIG. 5 is a graph to show a relationship between compression force and connectability in the second embodiment of the present invention.

All the results are shown in FIG. 5.

(Third Embodiment)

Figure 6A:
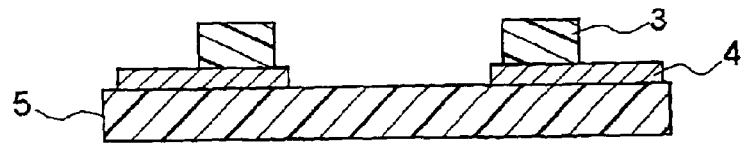
FIGS. 6A–6D are cross-sectional views to show a method of packaging an electronic element in a third embodiment of the present invention.
Figure 6B:
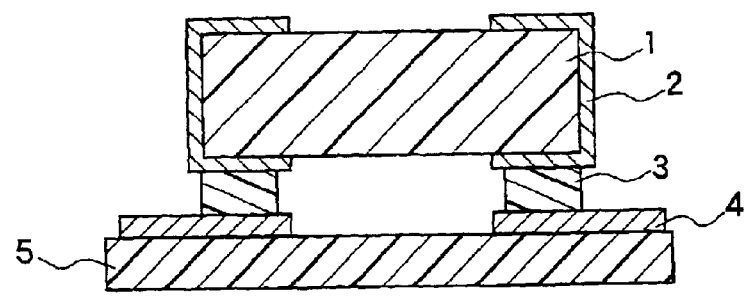
Figure 6C:
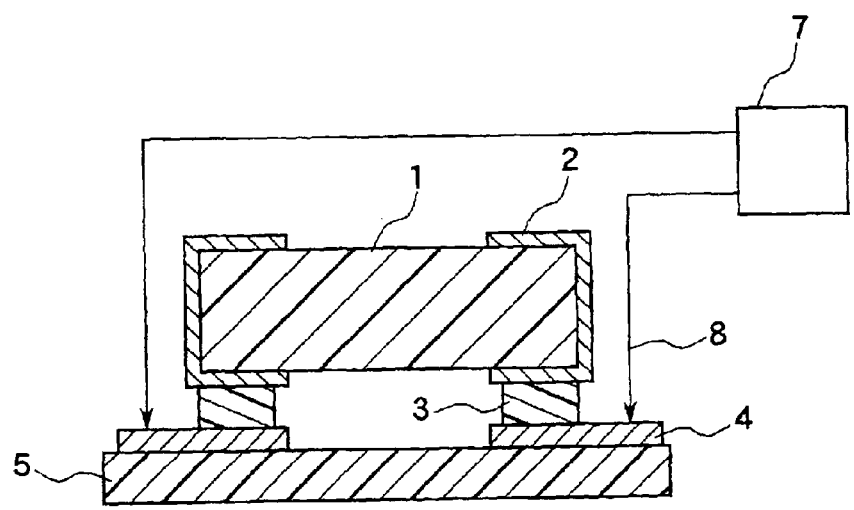
Figure 6D:
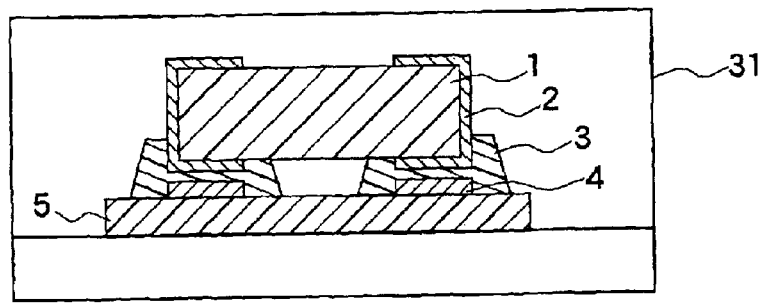

FIGS. 6A–6D are cross-sectional views to illustrate a method of packaging an electronic element in a third embodiment of the present invention. First, as shown in FIG. 3A, a conductive adhesive 3 is pattern-formed on a substrate electrode 4 of a circuit substrate 5. Next, as shown in FIG. 6B, a chip-type electronic element 1 such as a 3216-sized jumper chip resistor is mounted on a determined position of the conductive adhesive 3. Next, as shown in FIG. 6C, a contact probe 8 is contacted with the substrate electrode 4 in order to apply current from a power-supply unit 7. Next, as shown in FIG. 6D, the circuit substrate 5 with the mounted electronic element 1 is introduced into a hot air drying furnace 31 in order to harden the conductive adhesive 3.

This embodiment is characterized in that current is applied to a gap between the electronic element 1 and the circuit substrate 5 through the conductive adhesive 3 before hardening the conductive adhesive 3.

In a typical package comprising an electronic element 1 and a substrate electrode 4 connected by means of a conductive adhesive 3, the surface oxide layers of the electrodes remain. Since the surface oxide layers are insulating, the connection resistance is increased in the package, the initial value of the connection resistance is increased, and the reliability will vary remarkably. On the other hand, current is provided in this embodiment, so that the current flow is concentrated to the conductive filler surface having protrusions contained in the conductive adhesive 3 and also to the contact portion on the surfaces of the electrodes so as to form a concentrated local current. As a result, the surface oxide layers of the electrodes can be broken easily to lower the electric resistance.

(Fourth Embodiment)

Figure 7A:
FIGS. 7A–7D are cross-sectional views to show a method of packaging an electronic element in a fourth embodiment of the present invention.
Figure 7B:
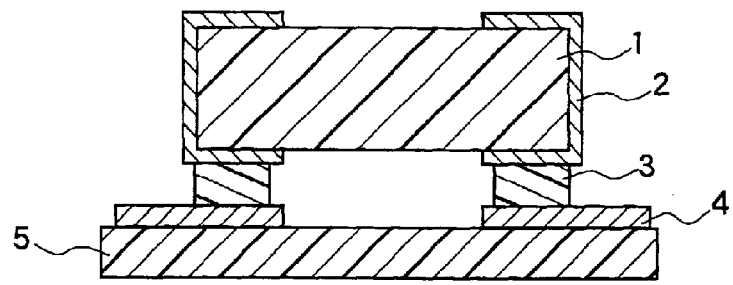
Figure 7C:
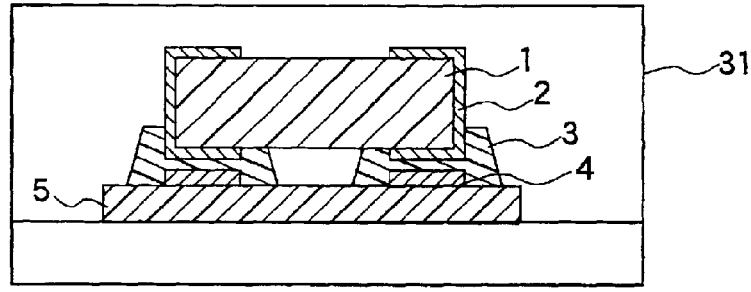
Figure 7D:
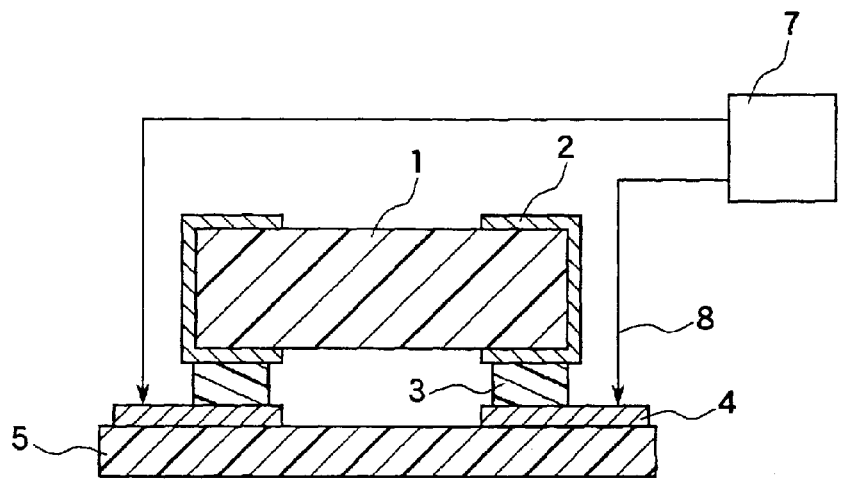

FIGS. 7A–7D are cross-sectional views to illustrate a method of packaging an electronic element in a fourth embodiment of the present invention. First, as shown in FIG. 7A, a conductive adhesive 3 is pattern-formed on a substrate electrode 4 of a circuit substrate 5. Next, as shown in FIG. 7B, a chip-type electronic element 1 such as a 3216-sized jumper chip resistor is mounted on a determined position of the conductive adhesive 3. Next, as shown in FIG. 7C, the circuit substrate 5 with the mounted electronic element 1 is introduced into a hot air drying furnace 31 in order to harden the conductive adhesive 3. Next, as shown in FIG. 7D, a contact probe 8 is contacted with the substrate electrode 4 in order to apply current from a power-supply unit 7.

This embodiment is characterized in that current is applied to a gap between the electronic element 1 and the circuit substrate 5 through the conductive adhesive 3 after hardening the conductive adhesive 3. Accordingly, the surface oxide layers of the electrodes become fragile as in the third embodiment so as to reduce the electrical resistance. In addition, yield of the packages in the process steps can be improved by supplying current after the hardening step in this embodiment.

For obtaining the effects described in the third and fourth embodiments, the current density range is from 0.01 A/mm$^2$ to 100 A/mm$^2$, preferably, from 0.1 A/mm$^2$ to 10 A/mm$^2$. The charging time is from 1 msec. to 5 sec., preferably, from 10 msec. to 1 sec.

A current density of less than 0.01 A/mm$^2$ is insufficient to break the surface oxide layers, while current density over 100 A/mm$^2$ may damage the electronic elements or the substrate electrodes. A charging time shorter than 1 msec. is insufficient to break the surface oxide layers, while a charging time longer than 5 sec. may damage the electronic elements or the substrate electrodes due to Joule heat or the like.

(Fifth Embodiment)

Figure 8A:
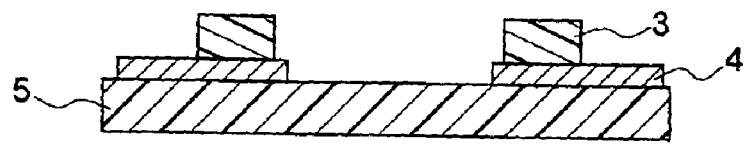
FIGS. 8A–8D are cross-sectional views to show a method of packaging an electronic element in a fifth embodiment of the present invention.
Figure 8B:
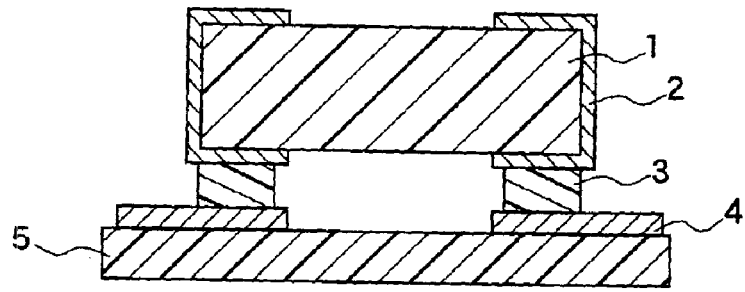
Figure 8C:
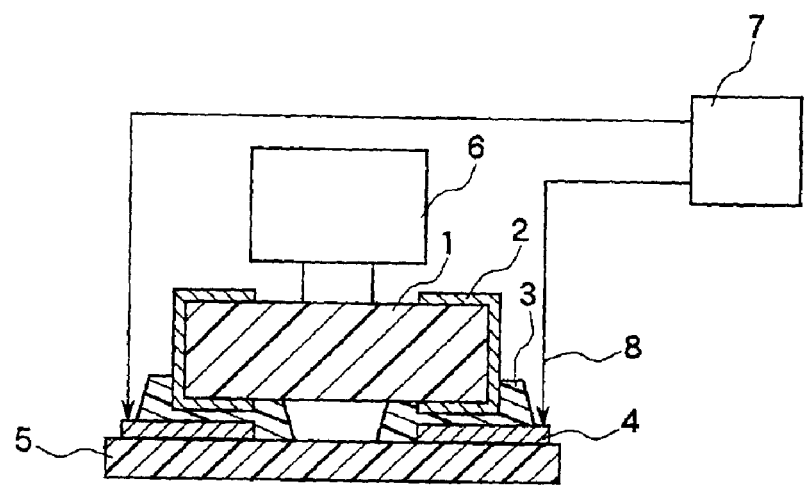
Figure 8D:
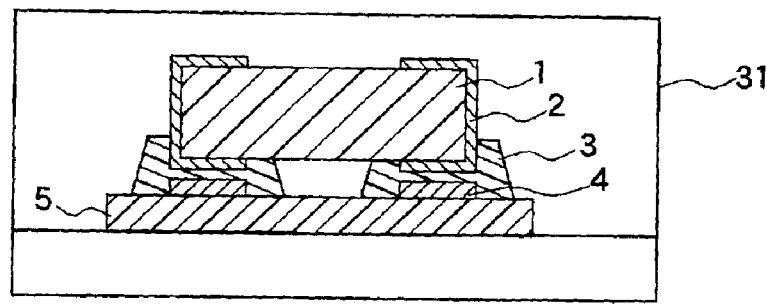

FIGS. 8A–8D are cross-sectional views to illustrate a method of packaging an electronic element in a fifth embodiment of the present invention. First, as shown in FIG. 8A, a conductive adhesive 3 is pattern-formed on a substrate electrode 4 of a circuit substrate 5. Next, as shown in FIG. 8B, a chip-type electronic element 1 such as a 3216-sized jumper chip resistor is mounted on a determined position of the conductive adhesive 3. Next, as shown in FIG. 8C, the electronic element 1 is pressed by means of a head 6 while a contact probe 8 is contacted with the substrate electrode 4 in order to apply current from a power-supply unit 7. Next, as shown in FIG. 8D, the circuit substrate 5 with the mounted electronic element 1 is introduced into a hot air drying furnace 31 in order to harden the conductive adhesive 3.

The packaging method in this embodiment comprises both compression and current application that is carried out before hardening the conductive adhesive 3. The applied pressure and current provide a multiplier effect over a total effect of separately performed compression and current application. That is, the pressure provides close contacts between the conductive filler and the electrodes, and increases the numbers of the contact points. When current is applied in this state, the surface oxide layer on an electrode becomes fragile. As a result, the surface oxide layer is broken and thus, the contact points at which the electrode metal and the conductive filler contact directly with each other will be increased. Moreover, since current flows in a state that the electrode metal and the conductive filler are contacted directly with each other, fusion of the electrode metal and the conductive filler is accelerated as in a case of fusion carried out by applying current. As a result, this embodiment can provide a package having less connection resistance and better reliability when compared to a case of performing either compression or current application alone.

(Sixth Embodiment)

Figure 9A:
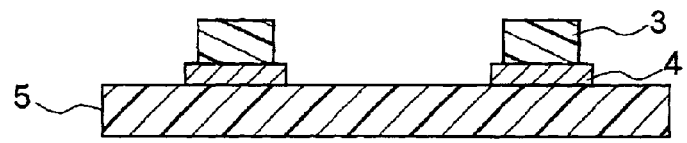
FIGS. 9A–9D are cross-sectional views to show a method of packaging an electronic element in a sixth embodiment of the present invention.
Figure 9B:
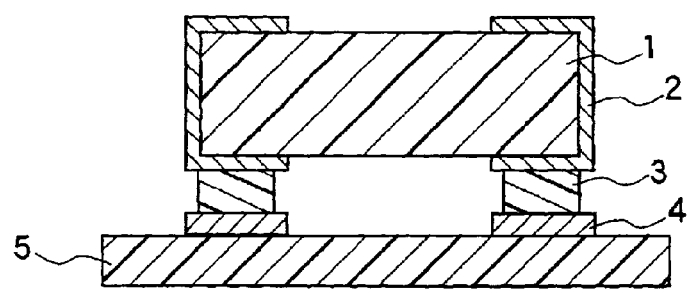
Figure 9C:
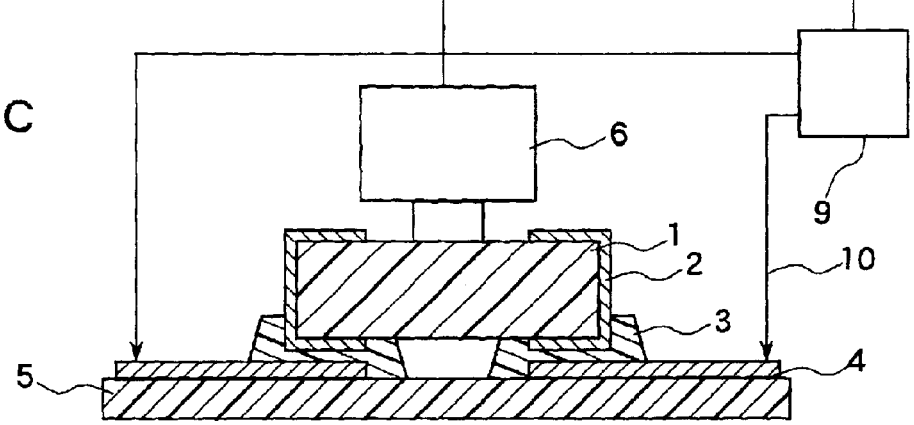
Figure 9D:
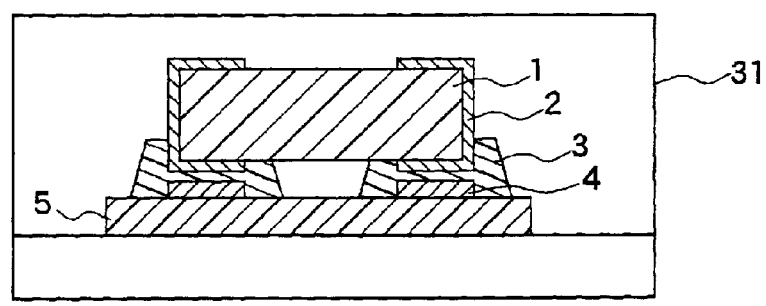

FIGS. 9A–9D are cross-sectional views to illustrate a method of packaging an electronic element in a sixth embodiment of the present invention. First, as shown in FIG. 9A, a conductive adhesive 3 is pattern-formed on a substrate electrode 4 of a circuit substrate 5. Next, as shown in FIG. 9B, a chip-type electronic element 1 such as a 3216-sized jumper chip resistor is mounted on a determined position of the conductive adhesive 3. Next, as shown in FIG. 9C, a contact probe 10 for measuring electrical resistance is contacted with the substrate electrode 5 to be connected with the electronic element 1 in order to measure the electrical resistance of the electronic element by means of a digital multi-meter 9 while pressing the electronic element 1 with a head 6 to determine its mount position. That is, the detected electrical resistance is fed back for controlling the compression through a feedback signal system 11. Alternatively and/or additionally, the electrical resistance is fed back for controlling the applied current. Next, as shown in FIG. 9D, a circuit substrate 5 subjected to the step of FIG. 9C is introduced into a hot air drying furnace 31 so as to harden the conductive adhesive 3.

This embodiment is characterized in that during mounting of an electronic element, the mounting state is controlled while detecting the electrical resistance between the electronic element 1 and the circuit substrate 5. This embodiment is distinguished from a method of controlling conditions of an interface between the conductive adhesive and the electrode in that the control is performed corresponding to the resulting connection resistance. Therefore, the embodiment can provide a package having connection resistance with reduced variation.

(Seventh Embodiment)

Figure 10A:
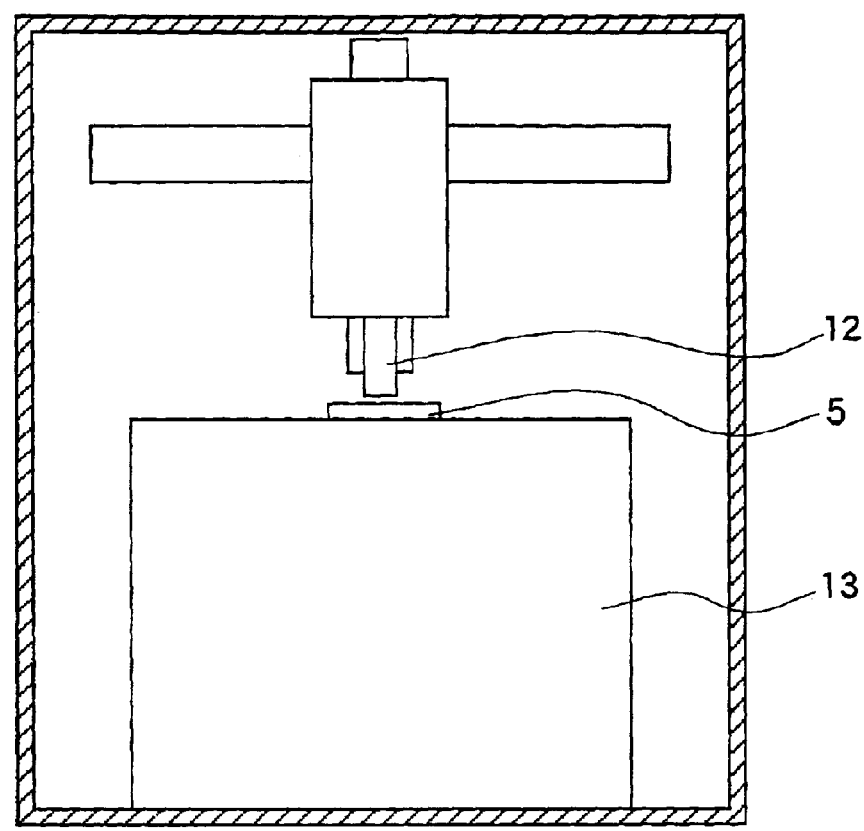
FIGS. 10A and 10B are cross-sectional views to show a device for packaging an electronic element in a seventh embodiment of the present invention.
Figure 10B:
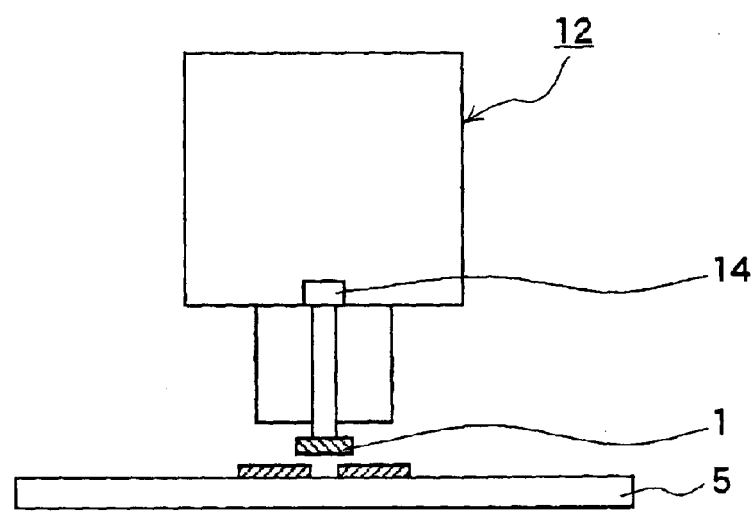

FIGS. 10A and 10B are schematic views to show a device for packaging electronic elements according to a seventh embodiment. FIG. 10A is a general schematic view of a packaging device, in which an electronic element to be packaged is carried by a head 12. A circuit substrate 5 provided with a conductive adhesive is mounted on a conveyor table 13. Similar to a commonly-used device for packaging electronic elements, the head 12 has a function to mount an electronic element on a predetermined substrate electrode of the circuit substrate 5 after adjusting the position.

FIG. 10B is an enlarged schematic view of the head 12. In this embodiment, a load cell 14 is provided for detecting weight applied to the electronic element 1 at the time of packaging, i.e., compression force of the head 12. There is no specific limitation on the load cell 14, as long as it is capable of measuring compression force at the time of packaging where the compression force corresponds to the pressure described in the second embodiment. Alternatively, the load cell 14 can be arranged separately from the head 12.

Similar mechanisms have been used for typical devices of packaging bare chip semiconductors, e.g., the aforementioned ACF. Nevertheless, the technique of the present invention can be distinguished from such devices for ACF packaging in that a device for ACF packaging comprises a pressing head having a heating mechanism for softening ACF, and that the conventional device has a difficulty in controlling a low pressure side within a compression force range described in the packaging method in the second embodiment.

(Eighth Embodiment)

Figure 11A:
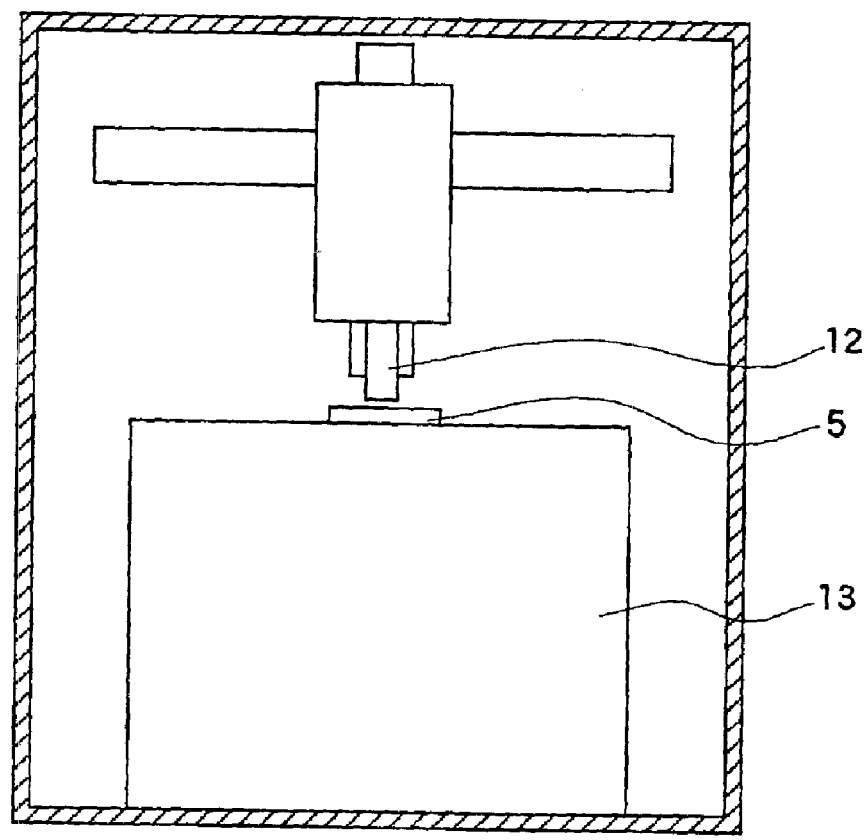
FIGS. 11A and 11B are cross-sectional views to show a device for packaging an electronic element in an eighth embodiment of the present invention.
Figure 11B:
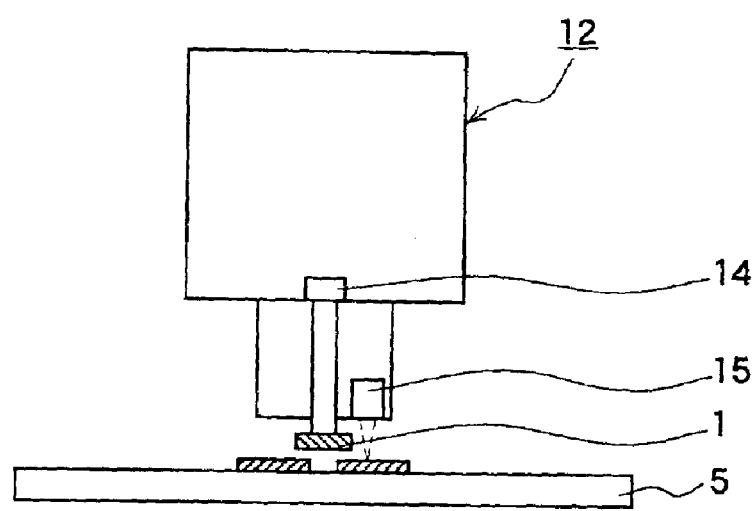

FIGS. 11A and 11B are schematic views to show a device for packaging electronic elements according to an eighth embodiment. FIG. 11A is a general schematic view of a packaging device, in which an electronic element to be packaged is carried by a head 12. A circuit substrate 5 provided with a conductive adhesive is mounted on a conveyor table 13. Similar to a commonly-used device for packaging electronic elements, the head 12 has a function to mount an electronic element on a predetermined substrate electrode of the circuit substrate 5 after adjusting the position.

FIG. 11B is an enlarged schematic view of the head 12. A spacing measurer 15 is attached to the top end of the head 12. The spacing measurer 15 detects spacing between the electronic element 1 and an electrode of the circuit substrate 5 at the time of packaging. There is no specific limitation on the spacing measurer 15, but preferably as described in the first embodiment, it controls the spacing to be not less than 1.1 times a minimum dimension (D min) of a smallest conductive filler contained in the conductive resin and not more than 20 times a maximum dimension (D max) of a biggest conductive filler contained in the conductive resin. An example thereof is a laser measurer. This spacing measurer 15 enables precise control of the spacing, and thus, it can provide a package of an electronic element that is less resistant and highly reliable.

The spacing measurer 15 can be arranged separately from the head 12.

(Ninth Embodiment)

Figure 12A:
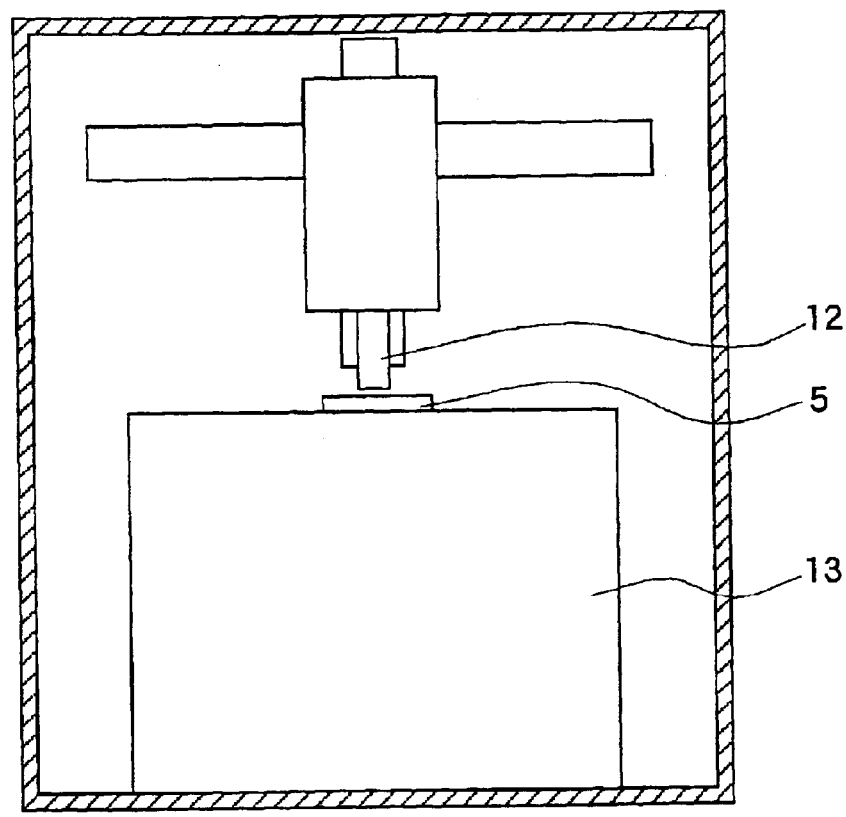
FIGS. 12A and 12B are cross-sectional views to show a device for packaging an electronic element in a ninth embodiment of the present invention.
Figure 12B:
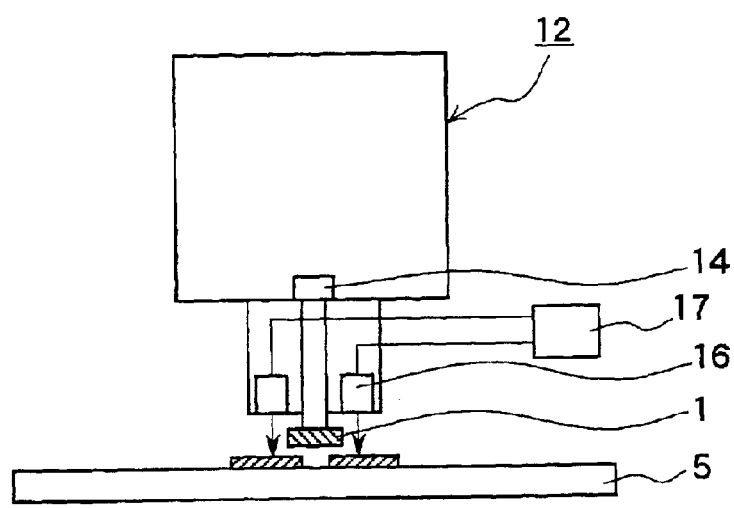

FIGS. 12A and 12B are schematic views to show a device for packaging electronic elements according to a ninth embodiment. FIG. 12A is a general schematic view of a packaging device, in which an electronic element to be packaged is carried by a head 12. A circuit substrate 5 provided with a conductive adhesive is mounted on a conveyor table 13. Similar to a commonly-used device for packaging electronic elements, the head 12 has a function to mount an electronic element on a predetermined substrate electrode of the circuit substrate 5 after adjusting the position.

FIG. 12B is an enlarged schematic view of the head 12. A contact probe 10 is attached to the top end of the head 12. The contact probe 10 is connected to a digital multi-meter 9 to measure electrical resistance of the electronic element 1 and of the circuit substrate 5 at the time of packaging. There is no specific limitation on the contact probe 10 and the instrument for measuring electrical resistance. The measured value of the electrical resistance is fed to a control mechanism of the head 12 through a feedback signal system 11. The contact probe 10 can be arranged separately from the head 12.

The packaging device in this embodiment is characterized in that it comprises not only a mechanism for mounting an electronic element but a mechanism to detect and control electrical resistance between the electronic element and a circuit substrate during compression. This mechanism enables precise control of an electrical contact state between the electrode and the conductive adhesive, and thus, it can provide a package of an electronic element that is less resistant and highly reliable.

(Tenth Embodiment)

Figure 13A:
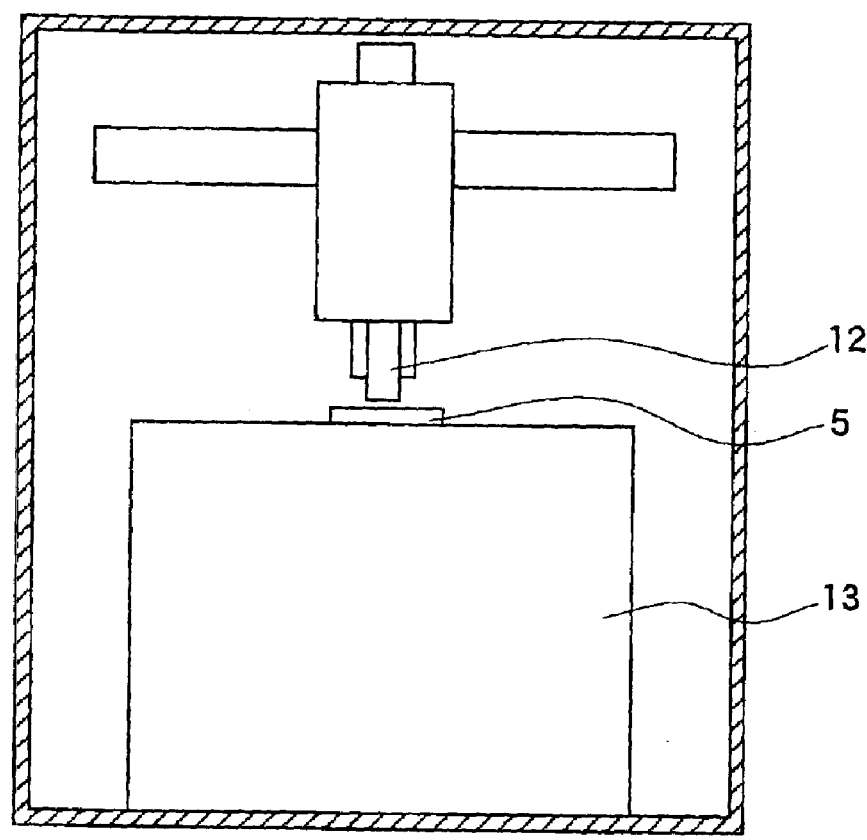
FIGS. 13A and 13B are cross-sectional views to show a device for packaging an electronic element in a tenth embodiment of the present invention.
Figure 13B:
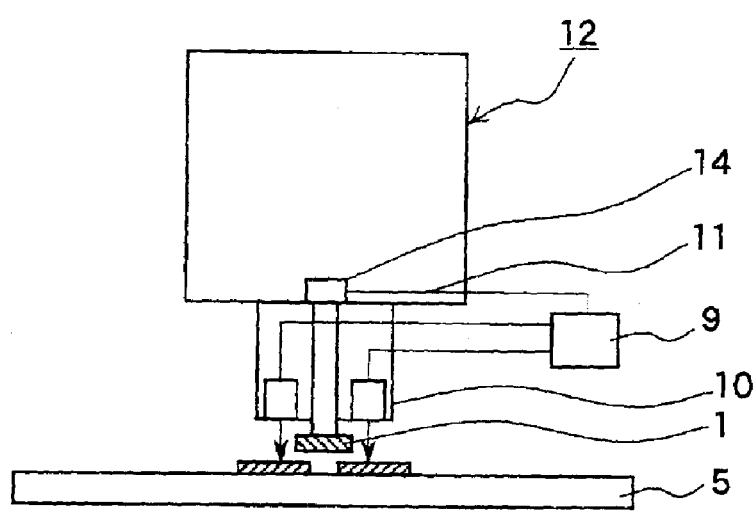
Figure 14:
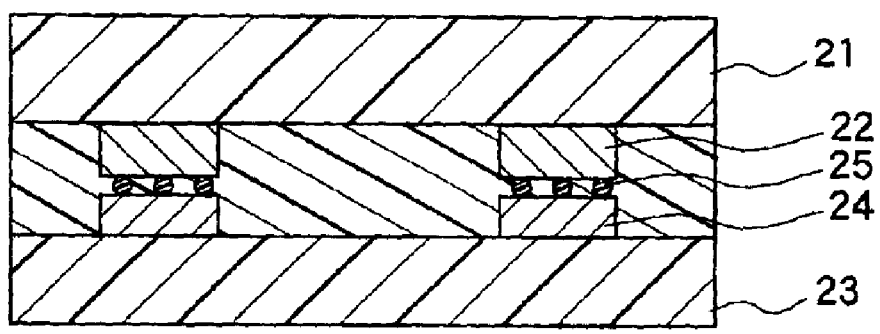
FIG. 14 is a cross-sectional view of a package of an electronic element in Examples 1–3 of the present invention.

FIGS. 13A and 13B are schematic views to show a device for packaging electronic elements according to a tenth embodiment. FIG. 13A is a general schematic view of a packaging device, in which an electronic element to be packaged is carried by a head 12. A circuit substrate 5 provided with a conductive adhesive is mounted on a conveyor table 13. Similar to a commonly-used device for packaging electronic elements, the head 12 has a function to mount an electronic element on a predetermined substrate electrode of the circuit substrate 5 after adjusting the position.

FIG. 13B is an enlarged schematic view of the head 12. A contact probe 16 is provided to the top end of the head 12, and it is connected to a power-supply unit 17. The power-supply unit 17 provides current to the gap between the electronic element and the circuit substrate through the contact probe 16. Additionally, it detects electrical resistance between the electronic element and the circuit substrate, and controls applied current on the basis of the electrical resistance.

There is no specific limitation on the contact probe 16 and the power-supply unit 17, as long as the current described in the fourth embodiment can be applied stably. The contact probe 16 can be arranged separately from the head 12.

The device for packaging according to this embodiment is characterized in that it comprises not only a mechanism for mounting an electronic element but a mechanism for detecting electrical resistance between the electronic element and the circuit substrate and for controlling applied current depending on the measured value of the electrical resistance. By controlling the current in this manner, electrical resistance between the electrode and the conductive adhesive can be reduced and controlled with a high accuracy. Accordingly, the thus produced package of an electronic element has low resistance and high reliability.

In each of the above-mentioned embodiments, there is no specific limitation on the resin components of the conductive adhesive 3. The examples include an epoxy resin, an acrylic resin, a phenol resin, a silicon resin, a polyimide resin, and a urethane resin. When an insulating resin 3 contains a resin material such as a mixture of silicone resin, polycarbonate, and a fluorine-based resin, it will be waterproof or have some other properties. When the insulating resin 3 contains a urethane resin or the like, it functions to relax stress and thus the connection is resistant to impact or the like.

The conductive filler of the conductive adhesive 3 can be selected from metals such as silver, gold, copper, nickel, palladium and tin; alloys; carbon and mixtures thereof, though the examples are not limiting.

The conductive adhesive 3 can be applied by means of screen-printing, a dispenser or the like.

The electronic element 1 is a 3216-sized jumper chip resistor in the embodiments of the present invention, but the kinds or shapes are not limited as long as it is selected from generally-used electronic elements such as capacitors, coils, and semiconductors.

The embodiments are not limited to a case of one-sided packaging as mentioned above, but it can be used for two-sided packaging and so on.

The present invention will be explained further by referring to the following examples.

EXAMPLE 1

The following examples refer to packages of electronic elements formed by using a conductive adhesive according to the present invention. FIG. 3A shows a package comprising a circuit substrate 5 having a substrate electrode 4 on which a conductive adhesive 3 is formed, and further an electronic element 1 is mounted thereon. The circuit substrate 5 is a FR-4 glass epoxy resin substrate having a thickness of 0.6 mm (FR-4 denotes a standard of glass epoxy resin substrate). The substrate electrode 4 is prepared by plating Ni of about 1 $\mu$m thickness on a surface of a copper foil having a thickness of about 12 $\mu$m, and further flash-plating gold on the Ni surface. The electronic element was a 3216-sized jumper chip resistor.

The conductive filler in the conductive resin was a silver powder having an irregular spherical shape and having an average particle diameter of 2.5 $\mu$m. The binder resin included an epoxy resin and an amine-based hardening agent.

The conductive filler and the binder resin were measured by volume, and kneaded by means of a three-roll type apparatus so as to provide a conductive adhesive.

The conductive adhesive is printed by means of a 0.1 mm thick stainless metal plate having an opening shaped similarly to a substrate electrode pattern of a circuit substrate. Subsequently, the 3216-sized chip resistor is mounted on the circuit substrate before a hardening step of 30 minutes in a 150° C. hot air circulating furnace.

Table 1 indicates a content in volume of the conductive filler in a conductive adhesive, a connection strength of a package of a 3216-sized chip resistor connected by means of the conductive resin, and connection resistance. A shear strength tester (a product of AIKOH ENGINEERING, in which a load cell was used) was used, in which the tester was arranged so that the longitudinal side of the chip resistor was contacted with a shear strength tester indenter. The chip resistor was contacted to the indenter at a shear speed of 10 mm/min., and the weight at the time that the chip resistor was dropped from the circuit substrate was determined as a shear adhesion strength. The connection resistance was measured by a two-terminal method by contacting a probe to the substrate electrode. Respectively ten samples were prepared for measuring the shear strength and connection resistance, and the figures in the table are the average values.

TABLE 1

| Sample No. | Conductive filler volume content (wt %) | Shear adhesion strength (N) | Connection resistance (m Ω) |
| --- | --- | --- | --- |
| 1 | 10 | 42.1 | 55 |
| 2 | 20 | 41.5 | 38 |
| 3 | 30 | 40.9 | 35 |
| 4 | 40 | 40.1 | 29 |
| 5 | 50 | 39.5 | 27 |
| 6 | 65 | 38.1 | 27 |
| Com. Ex. 1 | 85 (Conventional conductive adhesive) | 37.0 | 26 |
| Com. Ex. 2 | Solder connection | 52.9 | 19 |

Note:
Com. Ex. = Comparative Example

Figure 15:
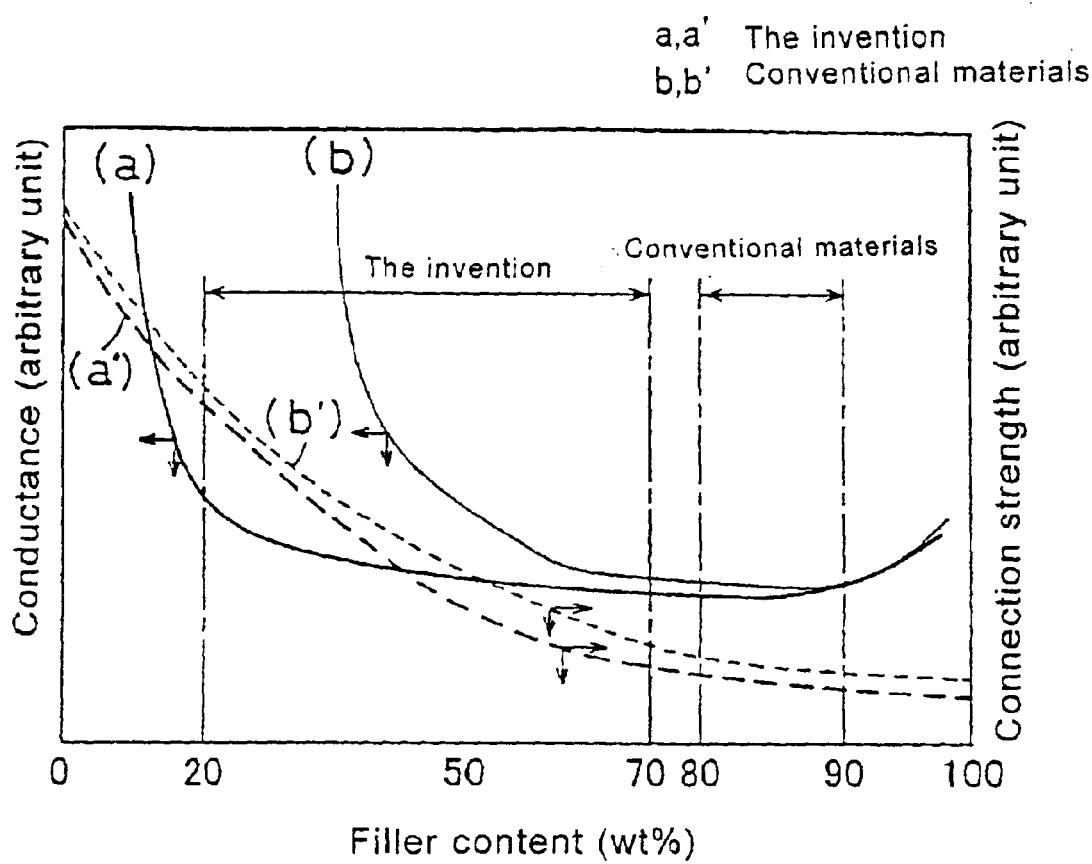
FIG. 15 is a graph to show conductive filler contents and characteristics of a conductive adhesive according to Example 1 and a conventional conductive adhesive.

As indicated in Table 1, connection strength of the conductive adhesives in this example was superior to that of conventional conductive adhesives since the contents of the conductive fillers were selected. The results are summarized in FIG. 15.

EXAMPLE 2

In Example 2, the silver powders are of a dendrite shape ("CUE07PB" (trade name) supplied by Kojundo Chemical Laboratory Co., Ltd.), scale shape ("TGG-1" (trade name) supplied by Tokuriki Chemical laboratory) and particle shape ("G-1" (trade name) supplied by Tokuriki Chemical laboratory). The binder resin contained an epoxy resin and an amine-based hardening agent. The conductive filler and the binder resin were measured by volume, and kneaded by means of a three-roll apparatus so as to provide a conductive adhesive. Example 2 is identical to Example 1 in the method of packaging electronic elements by using such a conductive adhesive and also a method of evaluating the packages. The evaluation results are shown in Table 2.

TABLE 2

| Sample No. | Shape and volume content of conductive filler (wt %) | Shear adhesion strength (N) | Connection resistance (m Ω) |
| --- | --- | --- | --- |
| 7 | Dendrite alone 10 | 42.1 | 38.5 |
| 8 | Dendrite alone 20 | 41.5 | 36.1 |
| 9 | Dendrite alone 40 | 40.9 | 30.3 |
| 10 | Dendrite alone 65 | 40.1 | 25.6 |
| 11 | Dendrite 10 + scale 10 | 41.8 | 37.5 |
| 12 | Dendrite 40 + scale 25 | 39.5 | 27.8 |
| 13 | Dendrite 25 + scale 40 | 38.1 | 28.2 |
| 14 | Dendrite 10 + particle 10 | 41.8 | 37.7 |
| 15 | Dendrite 40 + particle 25 | 40.3 | 28.0 |
| 16 | Dendrite 25 + particle 40 | 41.5 | 29.6 |
| 17 | Dendrite 10 + scale 10 + particle 10 | 40.6 | 36.4 |
| 18 | Dendrite 25 + scale 20 + particle 20 | 38.8 | 29.4 |
| Com. Ex. 3 | Scale alone (conventional conductive resin) | 38.8 | 26 |
| Com. Ex. 4 | Solder connection | 52.9 | 19 |

Note:
'scale' means a substantially scale shape, and 'particle' means a substantially particle shape.

As shown in Table 2, the conductive adhesives of this example had excellent connection strength while keeping the connection resistance low when compared to the conventional conductive adhesives since shapes and contents of the conductive fillers contained in the conductive adhesives were determined.

EXAMPLE 3

In Example 3, the binder resin was an elastic adhesive "PM100" (trade name) supplied by Cemedyne Co., Ltd. The conductive filler was a silver powder ("H-1" (trade name) supplied by Tokuriki Chemical Laboratory) of irregular spherical shape and having an average particle diameter of 2.5 μm.

The binder resin and the conductive filler were measured by volume, and kneaded by means of a three-roll apparatus so as to prepare a conductive adhesive.

Electronic elements were packaged by using the conductive adhesive in a method identical to that of Example 1. The adhesion strength was evaluated by measuring increase of connection resistance against bending displacement of the substrates. In the evaluation, each substrate packaged with a chip element was bent while being supported at three-points with a span of 50 mm so as to monitor the connection resistance at the time of the bending displacement of the substrate. A value of bending displacement of the substrate at the time that the connection resistance was increased from the initial value by 10% was determined as the bending displacement strength.

TABLE 3

| Sample No. | Conductive filler content (wt %) | Bending displacement strength (mm) |
| --- | --- | --- |
| 19 | 10 | 14.5 |
| 20 | 20 | 14.4 |
| 21 | 30 | 15.2 |
| 22 | 40 | 14.9 |
| 23 | 50 | 16.0 |
| 24 | 65 | 15.5 |
| Com. Ex. 1 | 85 (conventional conductive adhesive) | 2.4 |
| Com. Ex. 2 | Solder connection | 21.6 |

As indicated in Table 3, the bending displacement strength of the conductive adhesive according to Example 3 was improved in a comparison with those of conventional conductive adhesives, since the binder resin in Example 3 included an elastic adhesive.

In the present invention, the binder resin can be mixed with an elastic adhesive and a conventional epoxy adhesive.

EXAMPLE 4

A package of an electronic element according to the first embodiment was manufactured. The electronic element 1 was a solder-plated electrode of a 3216-sized jumper chip resistor, and the electronic component 1 was provided on a glass epoxy circuit substrate 6 corresponding to the packaging method of the second embodiment, by using a device for packaging electronic element as shown in the seventh embodiment.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position, and hardened at 150° C. for 30 minutes.

In Example 4, packages were manufactured by varying the compression force that is obtained by dividing a value of pressure detected at head of the packaging device by an area that the head contacts the conductive adhesive of the 3216-sized jumper resistor.

EXAMPLE 5

A package of an electronic element according to the first embodiment was manufactured by using a device for packaging electronic elements according to the eighth embodiment, on the basis of the packaging method according to the second embodiment, in which the package is mounted on a glass epoxy circuit substrate by means of an electronic element 1 as a 3216-sized jumper chip resistor of a solder-plated electrode.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position, and hardened at 150° C. for 30 minutes.

In Example 5, packages were manufactured by varying spacing between the element electrode and the substrate electrode, where the spacing was detected by using a head of the packaging device.

EXAMPLE 6

A package of an electronic element according to the first embodiment was manufactured by using a device for packaging electronic elements according to the ninth embodiment, on the basis of the packaging method according to the second embodiment, in which the package is mounted on a glass epoxy circuit substrate by means of an electronic element 1 as a 3216-sized jumper chip resistor of a solder-plated electrode.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position, and hardened at 150° C. for 30 minutes.

In Example 6, packages were manufactured by varying electrical resistance in the gap between the element electrode and the substrate electrode, which was detected by using a head of the packaging device during the mounting of the electronic element.

EXAMPLE 7

A package of an electronic element according to the first embodiment was manufactured by using a device for packaging electronic elements according to the tenth embodiment, on the basis of the packaging method according to the third embodiment, in which the package is mounted on a glass epoxy circuit substrate by means of an electronic element 1 as a 3216-sized jumper chip resistor of a solder-plated electrode.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position, and hardened at 150° C. for 30 minutes.

In this example, the electronic element was mounted by using a packaging device, and a package was manufactured by varying current amount applied from the head to the gap between the electronic element and the circuit substrate while the conductive adhesive is in a paste state. In this example, the current was applied for 25 msec. No effects were recognized when the application time was 1 msec. or less. When the time was longer than 5 sec., heat was generated in the gap between the chip resistor and the circuit substrate, and it caused foaming of the conductive adhesive.

EXAMPLE 8

A package of an electronic element according to the first embodiment was manufactured by using a device for packaging electronic elements according to the tenth embodiment, on the basis of the packaging method according to the fourth embodiment, in which the package is mounted on a glass epoxy circuit substrate by means of an electronic element 1 as a 3216-sized jumper chip resistor of a solder-plated electrode.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position, and hardened at 150° C. for 30 minutes.

In this example, packages were manufactured by varying current amount in the gap between the element electrode and the substrate electrode, where the current was applied from the head after hardening the conductive adhesive.

EXAMPLE 9

A package of an electronic element according to the first embodiment was manufactured by using a device for packaging electronic elements according to the tenth embodiment, on the basis of the packaging method according to the fifth embodiment, in which the package is mounted on a glass epoxy circuit substrate by means of an electronic element 1 as a 3216-sized jumper chip resistor of a solder-plated electrode.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position, and hardened at 150° C. for 30 minutes.

In this example, a package was manufactured by varying current amount applied from the head to the gap between the electronic element and the circuit substrate at the time of element mounting and also compression force detected by using the head at the time of the mounting of the electronic element.

EXAMPLE 10

A package of an electronic element according to the first embodiment was manufactured by using a device for packaging electronic elements according to the tenth embodiment, on the basis of the packaging method according to the sixth embodiment, in which the package is mounted on a glass epoxy circuit substrate by means of an electronic element 1 as a 3216-sized jumper chip resistor of a solder-plated electrode.

The terminal substrate electrode 4 of the circuit substrate 6 was a gold electrode. The conductive adhesive 3 was a thermosetting epoxy-based conductive adhesive that is available on the market. The conductive adhesive contains spherical conductive filler having a particle diameter in a range from 0.5 $\mu$m to 6 $\mu$m, and an average particle diameter of 3.3 $\mu$m.

An epoxy-based conductive adhesive 3 was applied by screen-printing onto a gold terminal substrate electrode 4 of the circuit substrate 6 so that the adhesive 3 had a thickness of about 0.1 mm. Later, a 3216-sized jumper chip resistor was mounted thereon after adjusting the mount position. The conductive adhesive was hardened by applying heat of 150° C. for 30 minutes by using a hot air circulating furnace so that the electronic element was connected to the circuit substrate.

In this example, a package was manufactured by varying electrical resistance between the element electrode and the substrate electrode detected by using the head of the packaging device at the time of mounting of the electronic element and also current amount applied at the time of mounting.

COMPARATIVE EXAMPLE 5

A package was manufactured in the following steps:

applying an epoxy-based conductive adhesive 3 by screen-printing onto a gold terminal electrode of a circuit substrate so that the adhesive 3 had a thickness of about 0.1 mm;

mounting a 3216-sized jumper chip resistor at a determined position; and hardening the conductive adhesive without applying pressure to the electronic element.

COMPARATIVE EXAMPLE 6

A package was manufactured in the following steps:

applying an epoxy-based conductive adhesive 3 by screen-printing onto a gold terminal electrode of a circuit substrate so that the adhesive 3 had a thickness of about 0.1 mm;

mounting a 3216-sized jumper chip resistor at a determined position; and hardening the conductive adhesive without applying current to the gap between the electronic element and the circuit substrate.

In an evaluation of the packages comprising 3216-sized jumper chip resistors manufactured in the examples, measurements were performed for the initial connection resistance, and also resistance after a reliability test in which the packages were kept under a condition of a temperature of 85° C. and a humidity of 85% for 100 hours. The results are shown in Tables 4–6.

TABLE 4

|  | Pressure (Pa) | Spacing ($\mu$m) | Head detection resistance (m $\Omega$) | Applied current density (A/mm$^2$) | Initial resistance (m $\Omega$) | Resistance after waterproof test (m $\Omega$) |
|---|---|---|---|---|---|---|
| Com. Ex. 5 | 0 | 90 |  |  | 542 | 1520 |
| Com. Ex. 6 |  |  |  | 0 | 556 | 1806 |
| Example |  |  |  |  |  |  |
| 4-1 | 5 K |  |  |  | 30 | 33 |
| 4-2 | 10 K |  |  |  | 28 | 29 |
| 4-3 | 20 K |  |  |  | 25 | 26 |
| 4-4 | 10 M |  |  |  | 21 | 21 |
| 4-5 | 20 M |  |  |  | 18 | 18 |
| 4-6 | 50 M |  |  |  | 17 | 17 |
| 4-7 | 60 M |  |  |  | Broken | Unmeasured |
| 5-1 |  | 90 |  |  | 542 | 1520 |
| 5-2 |  | 64 |  |  | 30 | 33 |
| 5-3 |  | 60 |  |  | 28 | 29 |
| 5-4 |  | 20 |  |  | 18 | 18 |
| 5-5 |  | 10 |  |  | 17 | 17 |
| 5-6 |  | 5 |  |  | Broken | Unmeasured |
| 6-1 |  |  | 100 |  | 85 | 266 |
| 6-2 |  |  | 39 |  | 32 | 38 |
| 6-3 |  |  | 31 |  | 24 | 26 |
| 6-4 |  |  | 23 |  | 22 | 22 |
| 6-5 |  |  | 18 |  | 17 | 17 |

TABLE 5

| Example | Pressure (Pa) | Spacing (μm) | Head detection resistance (mΩ) | Applied current density (A/mm²) | Initial resistance (mΩ) | Resistance after waterproof test (mΩ) |
|---|---|---|---|---|---|---|
| 7-1 | | | | 0.007 | 450 | 1669 |
| 7-2 | | | | 0.01 | 28 | 30 |
| 7-3 | | | | 0.1 | 24 | 25 |
| 7-4 | | | | 0.5 | 22 | 22 |
| 7-5 | | | | 5 | 20 | 20 |
| 7-6 | | | | 10 | 19 | 19 |
| 7-7 | | | | 50 | 18 | 18 |
| 7-8 | | | | 100 | 18 | 18 |
| 7-9 | | | | 110 | Broken | Unmeasured |
| 8-1 | | | | 0.007 | 180 | 504 |
| 8-2 | | | | 0.01 | 23 | 24 |
| 8-3 | | | | 0.1 | 21 | 21 |
| 8-4 | | | | 0.5 | 20 | 20 |
| 8-5 | | | | 5 | 18 | 18 |
| 8-6 | | | | 10 | 18 | 18 |
| 8-7 | | | | 50 | 17 | 17 |
| 8-8 | | | | 100 | 17 | 17 |
| 8-9 | | | | 110 | Broken | Unmeasured |

TABLE 6

| Example | Pressure (Pa) | Spacing (μm) | Head detection resistance (mΩ) | Applied current density (A/mm²) | Initial resistance (mΩ) | Resistance after waterproof test (mΩ) |
|---|---|---|---|---|---|---|
| 9-1 | 5 K | | | 5 | 24 | 24 |
| 9-2 | 10 K | | | 5 | 22 | 22 |
| 9-3 | 10 M | | | 5 | 19 | 19 |
| 9-4 | 50 M | | | 5 | 17 | 17 |
| 9-5 | 10 M | | | 0.007 | 19 | 19 |
| 9-6 | 10 M | | | 0.5 | 17 | 17 |
| 9-7 | 10 M | | | 10 | 17 | 17 |
| 9-8 | 10 M | | | 100 | 17 | 17 |
| 10-1 | | | 100 | 5 | 38 | 40 |
| 10-2 | | | 39 | 5 | 25 | 22 |
| 10-3 | | | 23 | 5 | 19 | 19 |
| 10-4 | | | 18 | 5 | 17 | 17 |
| 10-5 | | | 39 | 0.007 | 31 | 18 |
| 10-6 | | | 38 | 0.5 | 21 | 17 |
| 10-7 | | | 38 | 10 | 17 | 17 |
| 10-8 | | | 40 | 100 | 17 | 17 |

In Examples 4–10, the electrical resistance was lowered further in a comparison with Comparative Examples 5 and 6. Concerning the waterproof test, the resistance value in each of the Examples was lowered considerably while the resistance values were raised in Comparative Examples 5 and 6. Concerning the contact between the electrode and the conductive filler in the conductive adhesive at the connected parts, the surface oxide layers were not removed in the packages of the Comparative Examples 5 and 6, while the oxide layers were removed in each Example, so that the connection resistance in each Example is low and stable both initially and after the waterproof test.

INDUSTRIAL APPLICABILITY

As mentioned above, the present invention relates to a conductive resin with improved connection strength between the conductive resin and an electronic element, and also between the conductive resin and an electrode of a circuit substrate. The conductive resin containing an elastic adhesive as the binder resin component has stable connection resistance against bending deformation of the substrate. When the adhesive according to the present invention is compressed, the resin component squeezes out while the conductive filler component remains inside so as to raise the concentration of the conductive filler. This raises the concentration of the conductive filler and provides connection by scratching the electrode surface. As a result, the conductive adhesive can be provided onto the substrate electrode of the circuit substrate without using any solder, and an electronic element can be packaged.

Improvements in connection strength and cost reduction have been important objects in use for conventional conductive resins and packages of electronic elements using the conductive resins. The present invention can solve the problems, and thus, it can provide various electronic apparatuses that are environmentally-friendly.

Moreover, the present invention can improve connection between an electrode and a conductive filler of a conductive adhesive, and thus, the initial and long-term reliability can be improved compared to conventional techniques.

What is claimed is:

1. A package of an electronic element provided by electrically connecting a circuit substrate electrode to an electronic element electrode by means of a conductive adhesive containing main components of a conductive filler and a binder resin, wherein an average content of the conductive filler is in a range from 20 wt % to 70 wt %, the conductive filler is a mixture of 30–99 wt % of a metal filler having protrusions and 1–70 wt % of at least one filler having a shape selected from the group consisting of a scale, a flake and a particle, and the content of the conductive filler is higher than the average content for the adhesive present in a gap between the electrodes during packaging of the circuit substrate electrode and the electronic element electrode by interposing the conductive adhesive, and the content of the conductive filler becomes lower than the average content for the adhesive squeezed out of the gap, wherein the spacing between the element electrode and the substrate electrode is at least 1.1 times a minimum dimension (D min) of a smallest conductive filler contained in the conductive resin, and at most 20 times a maximum dimension (D max) of a biggest conductive filler contained in the conductive resin.

2. The package of an electronic element according to claim 1, wherein the conductive filler having protrusions is a dendrite filler.

3. The package of an electronic element according to claim 1, wherein the content of the conductive filler is in a range from 30 wt % to 50 wt %.

4. The package of an electronic element according to claim 1, wherein the conductive filler is at least one metal selected from the group consisting of copper, silver, gold, platinum, palladium, nickel, stainless steel and an alloy thereof.

5. The package of an electronic element according to claim 1, wherein the conductive filler is prepared by coating a metal with at least one substance selected from the group consisting of silver, gold and palladium.

6. The package of an electronic element according to claim 1, wherein the conductive filler has an average particle diameter ranging from 1 $\mu$m to 100 $\mu$m.

7. The package of an electronic element according to claim 1, wherein the binder resin is an elastic adhesive resin.

8. The package of an electronic element according to claim 1, wherein the content of the conductive filler is in a range from 75 wt % to 95 wt % for the adhesive in a gap between the circuit substrate electrode and the electronic element electrode.

9. The package of an electronic element according to claim 1, wherein the circuit substrate electrode and the electronic element electrode are connected to each other by being scratched partially on the surfaces by the metal filler having protrusions.

10. A packaging method comprising connecting electrically a circuit substrate electrode to an electronic element electrode by means of a conductive adhesive comprising a conductive filler and a binder resin as main components, wherein an average content of the conductive filler is in a range from 20 wt % to 70 wt %;

the conductive filler is a mixture of 30–99 wt % of a metal filler having protrusions and 1–70 wt % of at least one filler having a shape selected from the group consisting of a scale, a flake and a particle and the circuit substrate is connected to the electronic element electrode by:

applying the adhesive to a gap between the circuit substrate electrode and the electronic element electrode;

applying the circuit substrate electrode and the electronic element electrode with pressure ranging from 0.01 MPa to 50 MPa; and squeezing out the adhesive from the gap between the electrodes so that the adhesive remaining in the gap contains the conductive filler with a higher content than the average content;

wherein the spacing between the element electrode and the substrate electrode is at least 1.1 times a minimum dimension (D min) of a smallest conductive filler contained in the conductive resin, and at most 20 times a maximum dimension (D max) of a biggest conductive filler contained in the conductive resin.

11. The packaging method according to claim 10, wherein the conductive filler having protrusions is a dendrite filler.

12. The packaging method according to claim 10, wherein the content of the conductive filler is in a range from 30 wt % to 50 wt %.

13. The packaging method according to claim 10, wherein the conductive filler is at least one metal selected from the group consisting of copper, silver, gold, platinum, palladium, nickel, stainless steel and an alloy thereof.

14. The packaging method according to claim 10, wherein the conductive filler is prepared by coating a metal with at least one substance selected from the group consisting of silver, gold and palladium.

15. The packaging method according to claim 10, wherein the conductive filler has an average particle diameter ranging from 1 $\mu$m to 100 $\mu$m.

16. The packaging method according to claim 10, wherein the binder resin is an elastic adhesive resin.

17. The packaging method according to claim 10, wherein the content of the conductive filler is in a range from 75 wt % to 95 wt % for the adhesive in a gap between the circuit substrate electrode and the electronic element electrode.

18. The packaging method according to claim 10, wherein the circuit substrate electrode and the electronic element electrode are connected to each other by being scratched partially on the surfaces by the metal filler having protrusions.

* * * * *

UNITED STATES PATENT AND TRADEMARK OFFICE
CERTIFICATE OF CORRECTION

PATENT NO. : 6,916,433 B2
DATED : July 12, 2005
INVENTOR(S) : Mitani et al.

It is certified that error appears in the above-identified patent and that said Letters Patent is hereby corrected as shown below:

Title page,
Item [75], Inventors, "Yasuhiro Suzuki, Atani" should read -- Yasuhiro Suzuki, Atami --.

Column 22,
Line 18, "the average content;" should read -- the average content, --.

Signed and Sealed this

Twenty-eighth Day of March, 2006

JON W. DUDAS
*Director of the United States Patent and Trademark Office*